(12) United States Patent
Kobayashi et al.

(10) Patent No.: US 6,806,199 B2
(45) Date of Patent: Oct. 19, 2004

(54) METHOD FOR MANUFACTURING SILICON MIRROR WAFER, SILICON MIRROR WAFER, AND HEAT TREATMENT FURNACE

(75) Inventors: Norihiro Kobayashi, Annaka (JP); Shoji Akiyama, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 257 days.

(21) Appl. No.: 09/979,084

(22) PCT Filed: Feb. 28, 2001

(86) PCT No.: PCT/JP01/01482
§ 371 (c)(1),
(2), (4) Date: Nov. 16, 2001

(87) PCT Pub. No.: WO01/69666
PCT Pub. Date: Sep. 20, 2001

(65) Prior Publication Data
US 2002/0187658 A1 Dec. 12, 2002

(30) Foreign Application Priority Data
Mar. 16, 2000 (JP) .......................... 2000-74632

(51) Int. Cl.⁷ ............................................. H01L 21/302
(52) U.S. Cl. .................. 438/706; 438/692; 438/715; 438/770; 156/646.1; 118/715
(58) Field of Search ............................. 438/692, 693, 438/706, 715, 770; 156/345, 646.1; 118/715, 719

(56) References Cited

U.S. PATENT DOCUMENTS

| | | | |
|---|---|---|---|
| 5,405,446 A | | 4/1995 | Nakajima et al. |
| 5,611,685 A | * | 3/1997 | Nakajima et al. ........... 432/205 |
| 5,744,401 A | * | 4/1998 | Shirai et al. ................. 438/693 |
| 5,940,722 A | * | 8/1999 | Tamura ....................... 438/471 |
| 6,200,872 B1 | | 3/2001 | Yamada |
| 6,548,886 B1 | * | 4/2003 | Ikari et al. ................... 257/610 |

FOREIGN PATENT DOCUMENTS

| | | |
|---|---|---|
| JP | 3-188624 | 8/1991 |
| JP | 4-364028 | 12/1992 |
| JP | 7-037894 | 2/1995 |
| JP | 7-201769 | 8/1995 |
| JP | 7-321104 | 12/1995 |
| JP | 8-8264 | 1/1996 |
| JP | 8264552 A | 10/1996 |
| JP | 11-111668 | 4/1999 |
| JP | 11-135511 | 5/1999 |
| JP | 11-168106 | 6/1999 |

* cited by examiner

*Primary Examiner*—Lan Vinh
(74) *Attorney, Agent, or Firm*—Arent Fox, PLLC

(57) ABSTRACT

There are provided a manufacturing process for a mirror finished silicon wafer capable of manufacturing a mirror finished silicon wafer, having an excellent quality in which grown-in crystal defects are annihilated by heat-treating the silicon mirror finished wafer in a heat treatment in a gas atmosphere of high safety at a lower cost without selection of a heat treatment furnace for use in the heat treatment, a mirror finished silicon wafer having an excellent quality, and a heat treatment furnace preferably used in the manufacturing process. In the manufacturing process for a mirror finished silicon wafer comprising the steps of: connecting a reaction tube of a heat treatment furnace to a supply line for a non-oxidative raw material gas via a connection portion; supplying a non-oxidative gas into the reaction tube through the supply line and the connection portion; and heat-treating the mirror finished silicon wafer in the heat treatment furnace in an atmosphere of a non-oxidative gas, wherein a content of impurities in the non-oxidative gas supplied into the reaction tube is 3 ppm or less.

16 Claims, 4 Drawing Sheets

METHOD FOR MANUFACTURING SILICON MIRROR WAFER, SILICON MIRROR WAFER, AND HEAT TREATMENT FURNACE

This application is a 371 PCT/UP01/01482 filed on Feb. 28, 2001

TECHNICAL FIELD

The present invention relates to a manufacturing process for a mirror finished silicon wafer capable of manufacturing the mirror finished silicon wafer having an excellent quality in which grown-in crystal defects are annihilated by heat-treating the mirror finished silicon wafer in a gas atmosphere of high safety at a lower cost without selection of a heat treatment furnace for use in the heat treatment, a mirror finished silicon wafer having an excellent quality, and a heat treatment furnace preferably used in the manufacturing process.

BACKGROUND ART

It has been known that there exist defects named so-called grown-in defects such as COP (Crystal Originated Particle), oxide precipitates and so on in a CZ silicon wafer. A proposal has been made on a heat treatment performed in a hydrogen atmosphere (hereinafter may be referred to as "hydrogen annealing") as a method for annihilating grown-in detects in the vicinity of a wafer surface. This heat treatment is required to use hydrogen at a temperature of 1000° C. or higher, so it is necessary to take a countermeasure from the viewpoint of safety. Since such a treatment cannot be carried out in an ordinary open type furnace (a furnace with an unsealed opening side such as a horizontal furnace), the furnace is required to be modified with a sealed structure for increasing airtightness and an explosion-proof apparatus as a measure against an explosion, which have lead to a very high cost.

In FIG. 3, there is shown a schematic structure of an ordinary horizontal furnace. In FIG. 3, reference numeral 10 indicates a horizontal furnace, which has a quartz tube body, that is, a reaction tube 12. A gas supply port 14 for supplying a gas is provided at a front end of the reaction tube 12. At the rear end of the reaction tube 12 is provided a furnace opening 16 which is capable of opening and shutting by a cap 18. Where a hole 20 is formed in the cap 18, a supply gas is released to the outside of the furnace mainly through the hole 20. Where no hole 20 is formed, the supply gas is released to the outside of the furnace through a clearance between the cap 18 and the furnace opening 16. A wafer support Si boat 22 supporting vertically many wafers W is placed inside of the reaction tube 12. A heater 24 is provided outside of the outer periphery of the reaction tube 12 and the many wafers W placed inside of the reaction tube can be heat-treated.

Meanwhile, it has been recently found that even a heat treatment carried out in an argon atmosphere (hereinafter may be referred to as "Ar annealing") can annihilate the grown-in defects in the level equal to hydrogen annealing. Ar annealing is not explosive and then safer compared with hydrogen. Although the Ar annealing ensures safe operation, it has also been known that the annealing displays a characteristic behavior to a silicon wafer.

An example of such a characteristic behavior is a phenomenon that tiny pits are easily formed on a surface of a wafer subjected to the Ar annealing. This is caused by the following mechanism. An oxide film is formed by very small amounts of oxygen and water as impurities included in a raw material gas, or oxygen and water in the outside air involved through the furnace opening of the reaction tube in a heat treatment process, and then the oxide film is allowed to react with silicon (Si) according to the following reaction:

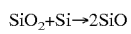

$SiO_2 + Si \rightarrow 2SiO$

As a result of the reaction, Si is etched and the etched portion is observed as pits. The pits serve as a cause for degrading a local surface roughness (micro-roughness) and a long-period surface roughness (haze) on a wafer surface. Thus, an Ar gas is sensitive to a trace of impurities and small changes in the environment such as fluctuations in temperature, so the Ar gas has a demerit of difficulty in handling.

As measures to prevent this phenomena from occurring, two methods have been mainly proposed: One proposal is that an impurity content in a raw material gas is restricted to 5 ppm or less, and a purge box is also provided at an opening of a heat treatment furnace to prevent the outside air from being involved when wafers are inserted into the furnace (JP A 99-135511).

The other proposal is a method in which wafers are kept at 300° C. or lower and inserted into the furnace in order to prevent the outside air from being involved into the furnace when the wafers are inserted into the furnace (JP A 99-168106). However, it is supposed with ease that these methods lead to complexity in the apparatus and lower productivity.

As described above, the hydrogen annealing and the Ar annealing can advantageously annihilate the grown-in defects and give an excellent oxide film dielectric breakdown strength characteristic, so they have been widely used recently. However, for the above-mentioned reasons, it has been considered that high quality annealed wafers cannot be produced in a furnace with poor airtightness such as a horizontal furnace.

In the recent trend that device makers and wafer makers introduce many heat treatment furnaces, an increasing number of the makers have introduced vertical furnaces for the purpose to save a floor space. A vertical furnace has been developed later than a horizontal furnace and enables a highly airtight structure; therefore, the vertical furnace has been profitably used in a variety of applications. Accordingly, in view of such recent introduction of the vertical furnaces, effective use of long-standing horizontal furnaces has been sought. However, since the horizontal furnaces lack airtightness as described above, the range of its use has been still limited.

As stated previously, the presence of the grown-in defects such as COP (Crystal Originated Particle) is taken up as one of causes for decreasing a product yield in a device process. The grown-in defect is one of causes for degrading the oxide film dielectric breakdown strength and disconnecting wiring. Particularly, the defects are the greatest factor for deterioration in the oxide film dielectric breakdown strength. In order to annihilate the COP, it has been found that the hydrogen annealing and the Ar annealing are effective. The hydrogen annealing is, however, problematic in a safety aspect because of the use of the hydrogen gas at high temperature. In order to avoid such a problem, there is used a safety apparatus which leads to complex and expensive facilities for the hydrogen annealing as well as to a decrease in productivity and an increase in a production cost.

On the other hand, the Ar annealing has a problem that pits are easily generated if an Ar gas is of low purity. Furthermore, at the same time that pits are generated, micro-roughness and haze on a wafer surface are deteriorated. It has been known that micro-roughness and haze affect the oxide film dielectric breakdown strength and mobilities of electrons and holes just under an oxide film of a transistor having a MOS structure (see J. Appl. Phys. 79(2), Jan. 15, 1996, p. 911). Especially, mobilities of carriers (electrons and holes) are required to improve with an increase in degree of integration of MOS transistors. It is therefore necessary not only to decrease grown-in defects, but also to reduce micro-roughness and haze.

The inventors have conducted, as shown in Experimental Example 1 described later, an investigation into and a research on a haze level on a wafer surface after Ar annealing performed in a horizontal furnace, which is generally used, of low cost and widely spread, and as a result, have found for the first time that the outside air intrudes into a reaction tube for a heat treatment through a poorly sealed part of a connection portion between the reaction tube and a supply line of a raw material gas, which deteriorates a haze level of a heat-treated wafer.

That is, a connection portion 28 between a gas supply port 14 of a front end of a quartz tube body (reaction tube) 12 of a heat treatment furnace 10 which is generally used as shown in FIG. 3, and a supply line 26 of a non-oxidative raw material gas is, in many cases, connected with a joint 30 made of fluorocarbon resin as shown in FIG. 2. A great amount of the raw material gas flows through the connection portion 28; therefore, it has been considered that there is no chance for the outside air to intrude into the interior of the quartz tube body. As a result of the inventors' detailed investigation, however, it has been found that if the connection portion 28 has a little leak, when a great amount of a raw material gas flows, the outside air is easy to intrude into the interior according to Bernoulli's theorem. The present invention has been made on the basis of such findings as obtained in the investigation.

It is an object of the present invention is to provide a manufacturing process for a mirror finished silicon wafer capable of manufacturing a mirror finished silicon wafer having an excellent quality in which grown-in crystal defects are annihilated by heat-treating the silicon mirror finished wafer in a heat treatment in a gas atmosphere of high safety at a lower cost without selection of a heat treatment furnace for use in the heat treatment, a mirror finished silicon wafer having an excellent quality, and a heat treatment furnace preferably used in the manufacturing process.

DISCLOSURE OF THE INVENTION

In order to achieve the above described object, according to the present invention there is provided a manufacturing process for a mirror finished silicon wafer comprising the steps of: connecting a reaction tube of a heat treatment furnace to a supply line for a non-oxidative raw material gas via a connection portion; supplying a non-oxidative gas into the reaction tube through the supply line and the connection portion; and heat-treating the mirror finished silicon wafer In the heat treatment furnace in an atmosphere of a non-oxidative gas, wherein a content of impurities in the non-oxidative gas supplied Into the reaction tube is 3 ppm or less. If an impurity concentration in the non-oxidative gas supplied Into the reaction tube of the heat treatment furnace is 3 ppm or less, preferably 1 ppm or less and more preferably 0.5 ppm or less, even when a wafer is annealed In the non-oxidative gas, a surface state of the wafer is not deteriorated.

As impurities contained in the non-oxidative gas, there can be named impurities originally contained in the non-oxidative raw material gas and/or the outside air intruding into the reaction tube.

In order to prevent the outside air from intruding into the reaction tube from the connection portion, the connection portion is preferably of a flange structure.

It is preferable to prevent the intrusion of the outside air to the possible lowest level from a furnace opening with a supply amount of the non-oxidative raw material gas being 15 l/min or more during the heat treatment.

In consideration of safety, there is used as the non-oxidative raw material gas, an Ar gas or an Ar gas including a hydrogen gas the content of which is equal to or less than a lower explosion limit (about 4% or less).

Advantages as described below can be enjoyed with any of a horizontal furnace and a vertical furnace in the above-mentioned heat treatment.

In cases where a process of the present invention is performed with a horizontal furnace, the advantages are listed as follows: (1) An annealed wafer with a good haze level which has not been obtained with a conventional horizontal furnace can be attained, (2) a heat treatment furnace in use requires no airtightness; therefore, an existing horizontal furnace can be put into practical use by simple and low cost improvement only, by which the application range of the horizontal furnace increases, and (3) there do not occur demerits such as (a) particles and (b) slip dislocations which arise when using a vertical furnace.

(a) As for the particles, the following explanation is given: In a case of a vertical furnace, in order to prevent a mirror finished surface side of a wafer (on which a device is fabricated) from contacting the boat, the wafer is usually placed on the boat with the mirror finished surface side up. Therefore, particles floating in the space within the heat treatment furnace fall by gravity to easily attach to the mirror finished surface sides of the wafer. In contrast to this, since in a horizontal furnace a wafer is heat-treated in a vertical position, there is free from such a fear.

(b) As for the resistance to the slip dislocations, the following explanation is given: In a case of a vertical furnace, a wafer is required to be supported almost horizontally; therefore, a stress acted on a supporting portion of the wafer increases by its own weight and hence longer slip dislocations are easily generated compared with a horizontal furnace. In a case of a horizontal furnace, however, wafers are held almost vertically; therefore, a stress on a wafer caused by its own weight is comparatively small, slip dislocations being hard to occur.

Furthermore, a process of the present invention is performed using a vertical furnace with merits compared with the conventional process in regard to the following points: (1) An annealed wafer with an improved haze level can be obtained compared with a conventional vertical furnace (a vertical furnace having airtightness as in a hydrogen annealing furnace), (2) since airtightness is unnecessary even in a vertical furnace, the number of necessary parts can be reduced compared with a hydrogen annealing furnace which requires airtightness, thereby enabling a low-priced, simple and convenient vertical furnace to be realized, and operability and reliability thereof to be improved.

A mirror finished silicon wafer of the present invention is manufactured by a manufacturing process for a mirror finished silicon wafer of the present invention, wherein a haze level is 0.1 ppm or less on the whole surface of the wafer, and a P-V value is 1.5 nm or less and a Rms value is 0.15 nm or less in each 2 $\mu$m×2 $\mu$m area thereof. Such a wafer has more excellent surface roughness across the whole surface of the wafer uniformly compared with an ordinary mirror finished wafer, so an extremely good oxide film dielectric breakdown strength characteristic can be obtained on the whole surface of the wafer.

A heat treatment furnace of the present invention is for beat-treating a mirror finished silicon wafer in an atmosphere of non-oxidative gas and comprises: a reaction tube of the heat treatment furnace; a supply line for a non-oxidative raw material gas; and a connection portion connecting the reaction tube and the supply line, wherein the non-oxidative gas is supplied through the supply line and the connection portion, and an intruding amount of the outside air from the connection portion during the heat treatment is 1 ppm or less of a supply amount of the non-oxidative raw material gas. Since a degree of deterioration of a surface roughness of an annealed wafer is affected largely by an intruding amount (a leakage) of the outside air from the connection portion, the intruding amount is necessary to be limited to at least 1 ppm or less and preferably 0.05 ppm or less in order to obtain a surface roughness of the same level as that of an ordinary mirror finished wafer.

It is preferable to prevent the intrusion of the outside air to the possible lowest level with a flange structure of the connection portion.

BEST MODE TO CARRY OUT THE INVENTION

Description will be given of one embodiment of the present invention below based on the accompanying drawings and examples shown in the figures are presented by way of illustration and it is needless to say that various modifications or alterations can be performed as far as not departing from the technical concept of the present invention.

Figure 1:
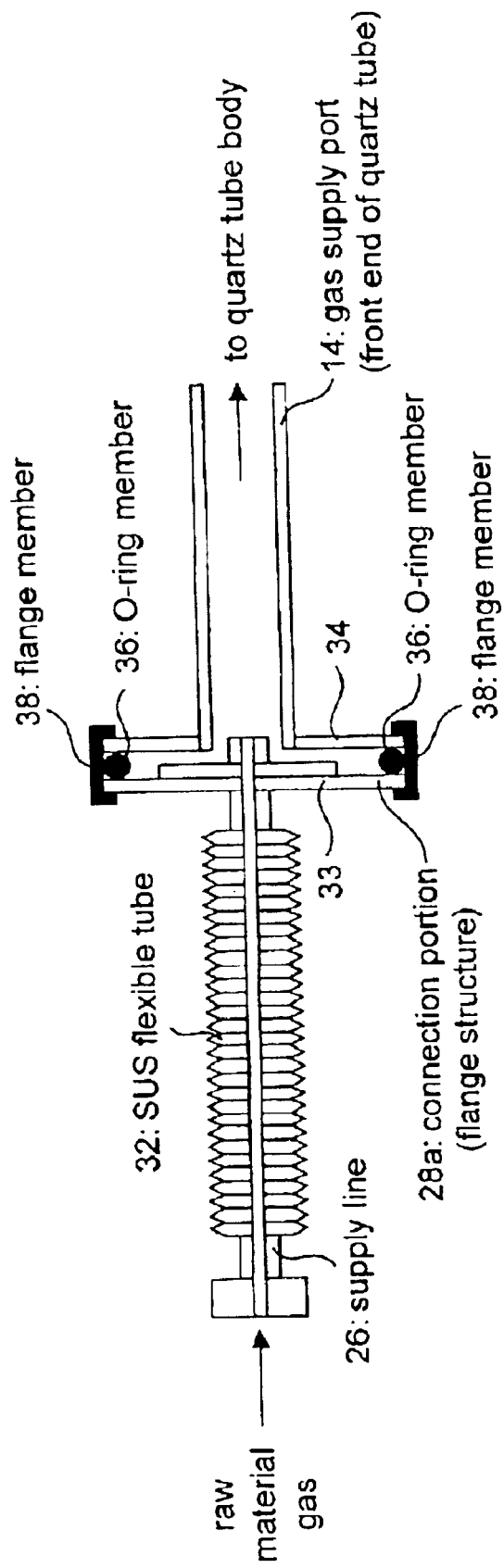
FIG. 1 is a schematic sectional explanatory view showing an embodiment of a connection portion between a supply line for non-oxidative raw material gas and a reaction tube (a quartz tube body) in a heat treatment furnace of the present invention.
Figure 2:
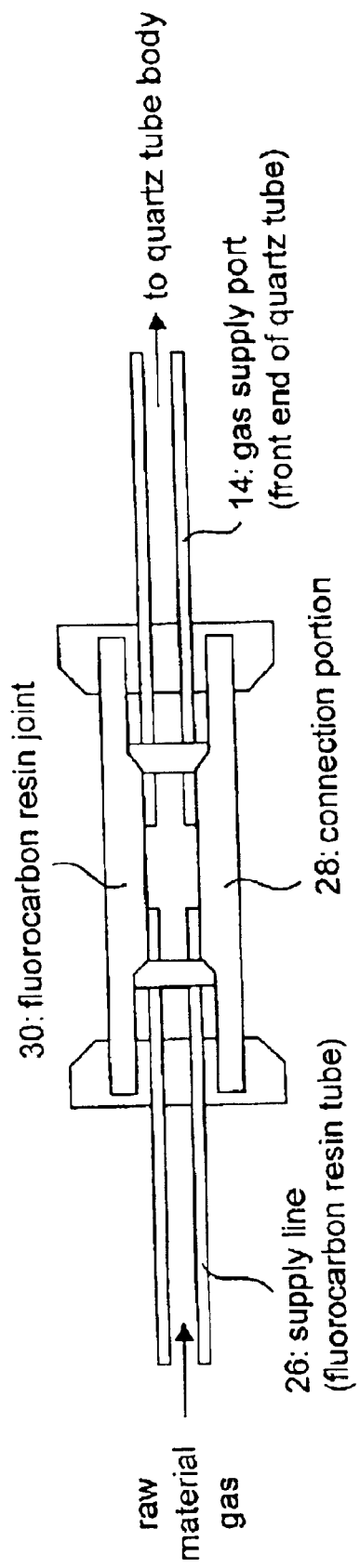
FIG. 2 is a schematic sectional explanatory view showing an embodiment of a connection portion between a supply line for a non-oxidative raw material gas and a reaction tube (a quartz tube body) in a conventional beat treatment furnace.

FIG. 1 is a schematic sectional explanatory view showing an embodiment of a connection portion between a supply line for a non-oxidative raw material gas and a reaction tube (a quartz tube body) in a heat treatment furnace of the present invention and in FIG. 1 the same symbols as those in FIG. 2 are used to indicate the same or like members in FIG. 2.

In FIG. 1, reference numeral 14 indicates a gas supply port at the front end of a quartz tube body (a reaction tube) 12. Reference numeral 26 is a supply line for a non-oxidative raw material gas. Reference numeral 32 is a flexible tube made of SUS (stainless steel) constituting the supply line 26. Reference numeral 28a indicates a connection portion connecting the supply line 26 with the gas supply port 14 at the front end of the quartz tube body (the reaction tube) 12 and the connection portion is of a structure in which intrusion of the outside air can be prevented to the possible lowest level compared with a conventional connection portion 28 shown in FIG. 2.

That is, the connection portion 28a is of a flange structure in which a rear-end mounting plate 33 provided at the rear end of the supply line 26 and a front-end mounting plate 34 provided opposing to the rear-end mounting plate 33 at the front end of the supply port 14 are joined together with a flange member 38 and an interposing O-ring member 36. Note that it is preferable that the supply port (the front end of the quartz tube) 14 and the front-end mounting plate 34 are welded together. With the connection portion 28a of such a structure, intrusion of the outside air can be greatly restricted compared with the conventional connection portion 28 as shown in FIG. 2.

Description will be given of the present invention taking up examples in more detail below, and it is needless to say that the examples are intended by way of illustration but not construed by way of limitation.

EXPERIMENTAL EXAMPLE 1

First, using a horizontal furnace generally used, low-priced and widely spread, Ar annealing was performed and followed by investigation of haze levels on surfaces of the annealed wafers.

It has been known that a haze level on a surface of a wafer subjected to Ar annealing is different according to an angle of misorientation of the used wafer (JP A 96-321443); therefore, in this experiment, there were used for a heat treatment only wafers each having a misorientation angle within ± about 0.2° from the (100) plane.

Figure 3:
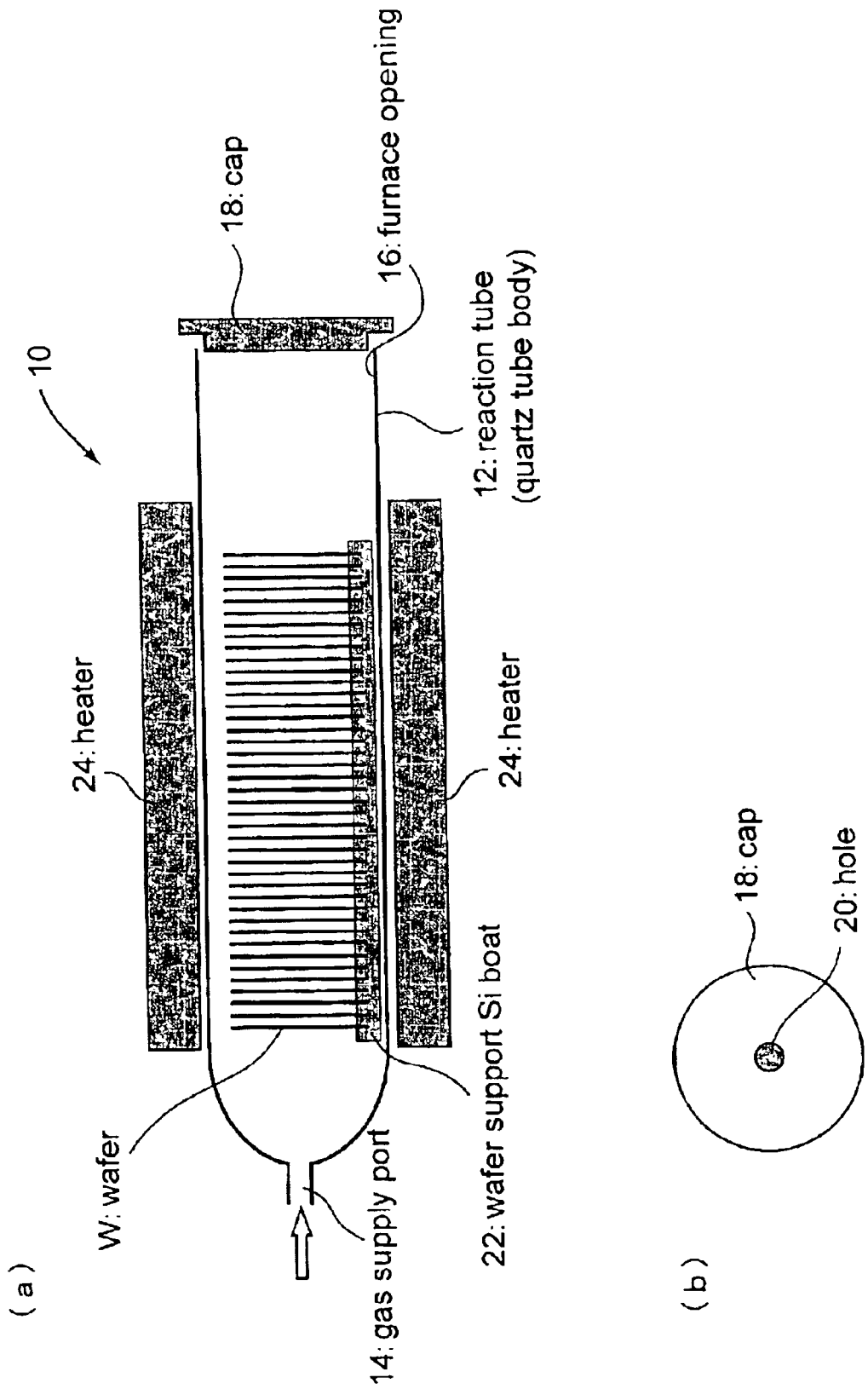
FIG. 3 is a schematic sectional explanatory view showing an embodiment of a conventional heat treatment furnace.

A conventional horizontal heat treatment furnace shown in FIG. 3 was used as a heat treatment furnace. The furnace opening 16 of the quartz tube body 12 which is a reaction tube of the horizontal furnace is closed by the quartz cap 18 for a heat treatment and the hole 20 of about 12.5 cm$^2$ is formed in the cap 18. An Ar gas including impurities of 1 ppm or less was used and a supply gas flow rate into the reaction tube was 20 l/min. Note that the term a "supply gas flow rate" means a flow rate of the gas at almost room temperature prior to introduction into the reaction tube. Haze was measured with Surfscan SP-1 made by KLA-Tenchor Corporation. With this measuring apparatus, a wafer surface is scanned with laser light to measure a scattering light intensity, and a scattering light intensity to incident light is obtained in ppm units.

It was found that a haze level of each of wafers subjected to the Ar annealing at 1150° C. for 4 hours under the above-described conditions was about 1.25 ppm in average across a wafer surface and greatly deteriorated compared with a haze level, about 0.05 ppm, of a wafer prior to the heat treatment (a mirror finished wafer of an ordinary product grade, which may be hereinafter referred to as PW).

That is, in such a horizontal furnace, it is considered that the outside air intrudes into the furnace from the furnace opening during a heat treatment, as has been conventionally stated, and a trace of oxygen and water are mixed into an Ar gas of an atmosphere gas to deteriorate a haze level. Then, a concept came to mind in which intrusion of the outside air could be prevented with increase in flow rate of the gas at the hole 20 of the cap 18 of the furnace opening 16 and an investigation about a haze level was conducted changing an area of the hole 20 and the supply gas flow rate.

In order to adjust an outlet area of the gas, a circular hole (an opening) is formed in the middle of the quartz cap 18. A magnitude of the hole was varied in 8 ways and set in the range of about 0.8 to 16 cm$^2$ in the opening area (the outlet area). The quartz tube body 12 and the cap 18 were fitted with each other by lapping with no additional, special leak-proof measure applied. The heat treatment was performed in a 100% Ar gas atmosphere under conditions of 1150° C. for 4 hours and wafers W for investigation of haze were placed in the closest positions to the furnace opening. Measurement results (values measured using the wide channel of Surfscan SP-1) on haze after the heat treatment are shown in FIG. 4.

Figure 4:
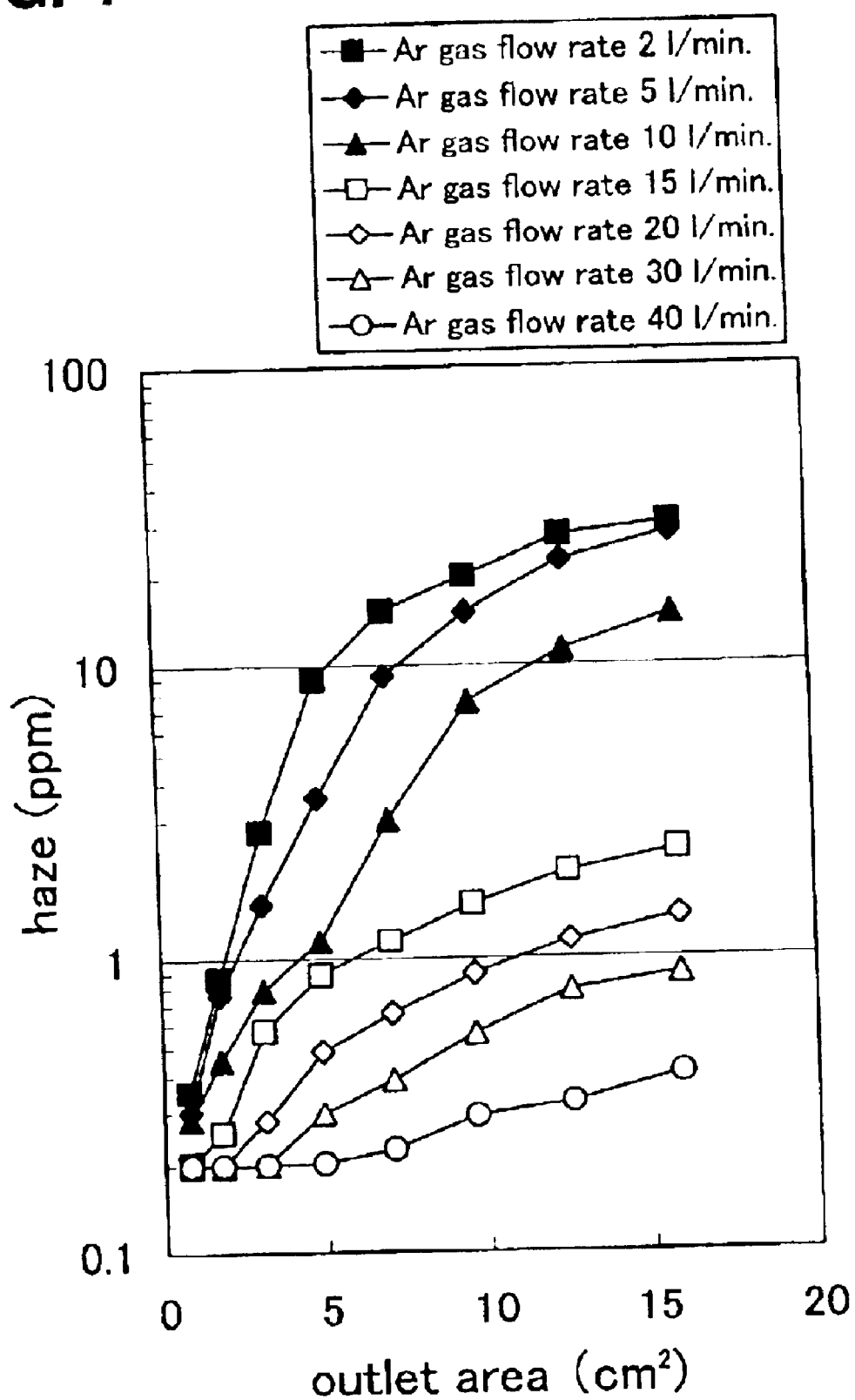
FIG. 4 is a graph showing a relationship between an outlet area and haze in Experimental Example 1.

From the results shown in FIG. 4, it was found that in order not to deteriorate haze, a smaller outlet area (a smaller hole area) is necessary where a flow rate of the Ar gas is low, but surface roughening of a wafer occurs at a low level even when an outlet area is somewhat large where the flow rate is high. It was further found that when a supply gas flow rate is set to 15 l/min or more, a deterioration degree of haze is small with increase in outlet area, and when a supply gas flow rate (L) and an area (S) of the hole were adjusted such that a ratio of L/S is almost 10 l/min-cm$^2$ or more, a haze level after the heat treatment was able to be restricted to the order of 0.2 ppm. Since the haze level after the heat treatment still showed two times or more as large as a haze level of an ordinary PW, it was thought out that there was a further cause for generation of haze in addition to the conventionally revealed causes, that is, intrusion of the outside air from a furnace mouth and an impurity concentration in a raw material gas.

Therefore, as a result of a serious research that has been repeated on haze deterioration causes, it has been found that haze levels of heat-treated wafers are deteriorated by intrusion of the outside air through an insufficiently sealed part in the connection portion between a reaction tube of each heat treatment furnace in which a heat treatment is performed and a supply line of a raw material gas, as shown in following Example 1 and Comparative Examples 1 to 3.

EXAMPLES 1 AND 2 AND COMPARATIVE EXAMPLES 1 to 3

As regards the connection portion between a reaction tube (a quartz tube body) of a horizontal furnace (UL-260-10H made by Tokyo Electron Limited) and a supply line of a raw material gas, a conventional structure using the fluorocarbon resin joint 30 of FIG. 2 was improved into a flange structure with an interposing sealing member (herein a rubber O-ring member) as shown in FIG. 1.

In order to measure a leakage through the connection portion having a flange structure, a gas sampling tube was inserted at the furnace opening such that the front end of the tube was located in the vicinity of a gas supply port of the heat treatment furnace while an Ar gas as a raw material gas was supplied at a flow rate of 20 l/min into the heat treatment furnace through the connection portion, and the supply gas after having passed through the connection portion was thereby guided into the gas sampling tube to measure an oxygen concentration in the supply gas by means of a trace oxygen concentration measuring apparatus connected to the gas sampling tube. Furthermore, with the same trace oxygen concentration measuring apparatus, an oxygen concentration in the raw material Ar gas was measured to compare the measured values and determine the leakage from the connection portion having the flange structure, with the result that the leakage was found to be about 0.2 ppm. On the other hand, it was also found that when the conventional fluorocarbon resin joint was used a leakage was found to be about 5 ppm by the use of the same measuring method as described above.

Then, annealing was performed in a horizontal furnace having the flange structure and a horizontal furnace using the fluorocarbon resin joint.

The standards of each of wafers used in the annealing were as follows: diameter of 150 mm φ, p-type, plane orientation (100), misorientation angle within ± about 0.2° and resistivity of 10 Ω·cm.

The annealing was performed at 1200° C. and for 60 min. in an Ar gas (a 100% Ar gas), wherein an impurity concentration (a total concentration of nitrogen, oxygen, hydrogen, carbon monoxide and methane) in a supply gas (a raw material Ar) was set at three levels: 0.15 ppm, 0.7 ppm and 3 ppm. Besides, a supply gas flow rate was set to 20 l/min.

Experiments were conducted in combination of such conditions and evaluations were carried out on haze, micro-roughness by means of AFM (Atomic Force Microscope), and oxide film dielectric breakdown strength. Evaluation results on haze were obtained as shown in Table 1. Note that haze was measured in the wide channel of Surfscan SP-1 made by KLA-Tencor Corporation.

TABLE 1

| | | Haze (ppm) | |
|---|---|---|---|
| | Conditions | In the center | At 10 mm from peripheral edge |
| Example 1 | flange connection + Ar gas with impurity of 0.15 ppm | 0.05 | 0.05 |
| Example 2 | flange connection + Ar gas with impurity of 0.7 ppm | 0.05 | 0.09 |
| Comparative Example 1 | flange connection + Ar gas with impurity of 3 ppm | 0.06 | 1.08 |
| Comparative Example 2 | fluorocarbon resin connection + Ar gas with impurity of 0.15 ppm | 0.06 | 2.50 |
| Comparative Example 3 | fluorocarbon resin connection + Ar gas with impurity of 3 ppm | 0.07 | 6.20 |

As shown in Table 1, only in the conditions of Example 1 or 2 (flange connection+Ar gas with impurity of 0.15 ppm or 0.7 ppm), uniform haze was observed on each wafer surface. In the other three conditions (Comparative Examples 1 to 3), a distribution of haze on each wafer surface was extremely non-uniform and furthermore, deterioration in haze was observed in the periphery of each wafer.

Surfaces of the wafers were observed with AFM and observation results on micro-roughness (P-V and Rms) are shown in Table 2. A measuring apparatus used in the measurement was an Atomic Force Microscope (AFM: Nanoscope III made by Digital Instrument, Inc.).

TABLE 2

| | P-V (nm) | | Rms (nm) | |
|---|---|---|---|---|
| | In the center | At 10 mm from peripheral edge | In the center | At 10 mm from peripheral edge |
| Example 1 | 1.10 | 1.09 | 0.10 | 0.11 |
| Example 2 | 1.11 | 1.22 | 0.11 | 0.13 |
| Comparative Example 1 | 1.15 | 2.21 | 0.12 | 0.23 |
| Comparative Example 2 | 1.10 | 6.34 | 0.12 | 0.28 |
| Comparative Example 3 | 1.13 | 7.48 | 0.16 | 0.59 |

According to the AFM observation, a very small step at an atomic level peculiar to the Ar annealing was observed on a wafer annealed in the condition of Example 1. Protrusions and pits were observed on wafers annealed in the condition of Comparative Example 3 but no atomic step peculiar to the Ar annealing was observed on the wafers. The pits are considered to be generated through a process in which Si reacts with a trace of oxygen in Ar to form an oxide film and further the oxide film reacts with Si to form SiO which evaporates. In contrast, the protrusions are considered to be generated and observed through a process in which a trace of nitrogen in Ar reacts with Si to form a nitride film, the nitride film remains without being etched off in the Ar annealing, and pits are generated around each of the nitride film, thereby the protrusions being left behind.

As seen from Table 2, the P-V values and Rms values on the wafers in Examples 1 and 2 showed more excellent values compared with an ordinary PW (P-V: 1.6 nm and Rms: 0.16 nm) not subjected to Ar annealing.

Then, investigations were performed about oxide film dielectric breakdown strength. Oxide films were grown to a thickness of 25 nm each on wafers annealed in the conditions of the Examples 1 and 2, and Comparative Examples 1 to 3, respectively. Phosphorous-doped polysilicon was deposited on each oxide film and patterning was performed so as to form an electrode of 4 mm$^2$. A TDDB (Time Dependent Dielectric Breakdown) characteristic as a kind of the oxide film dielectric breakdown strength was measured on the wafers in measuring conditions of 100 measuring dots per wafer and a stress current value of 0.01 A/cm$^2$. The measuring results were shown in FIG. 3.

TABLE 3

| | Conditions | Early failure |
|---|---|---|
| Example 1 | flange connection + Ar gas with impurity of 0.15 ppm | 1 |
| Example 2 | flange connection + Ar gas with impurity of 0.7 ppm | 2 |
| Comparative Example 1 | flange connection + Ar gas with impurity of 3 ppm | 13 |
| Comparative Example 2 | fluorocarbon resin connection + Ar gas with impurity of 0.15 ppm | 12 |
| Comparative Example 3 | fluorocarbon resin connection + Ar gas with impurity of 3 ppm | 15 |

As shown in Table 3, the percentages of the early failure (a proportion of dielectric breakdowns generated in a short time after a stress current is applied) of TDDB of wafers treated in the conditions of Examples 1 and 2 were very low at 1% and 2%. In contrast there to, the percentages of the early failure of TDDB of wafers treated in the other three conditions of Comparative Examples 1 to 3 were high at 12 to 15% and especially in respect to a distribution on a wafer surface, regions in which the early failure is generated concentrated in the peripheral area of each wafer. It is understood that where haze on a surface of a wafer is in a good state and distributed uniformly on the surface, very good oxide film dielectric breakdown strength was observed on the wafer.

As clearly seen from the results of the above described experiments, the wafers treated in the conditions of Examples 1 and 2 had haze and P-V values and Rms values in each region of 2 μm×2 μm equal to or less than respective given values, and showed excellent oxide film dielectric breakdown strength.

The peripheral area of each of the wafers treated in the conditions of Comparative Examples 1 to 3 had haze and P-V values and Rms value in each 2 μm×2 μm region deteriorated compared with respective values of an ordinary PW, and showed poor oxide film dielectric breakdown strength.

The results of the Examples and Comparative Examples show influences of impurities in an Ar gas supplied and impurities leaked from the connection portion, and make clear that the present invention is effective for not only a horizontal furnace but also a vertical furnace.

Capability of Exploitation in Industry

As described above, a manufacturing process for a mirror finished silicon wafer of the present invention is capable of manufacturing a mirror finished silicon wafer having an excellent quality in which grown-in crystal defects are annihilated by heat-treating the mirror finished silicon wafer in a heat treatment in a gas atmosphere of high safety at a low cost without selection of a heat treatment furnace for use in the heat treatment.

According to a mirror finished silicon wafer of the present invention, a haze level, a P-V value and an Rms value can be controlled to given values or less; therefore, a product yield in a device process can be prevented from decreasing.

According to a heat treatment furnace of the present invention, intrusion of the outside air is prevented to the possible lowest level and is preferably used for the practice of the process of the present invention.

What is claimed is:

1. A manufacturing process for a mirror finished silicon wafer comprising the steps of: connecting a reaction tube of a heat treatment furnace to a supply line for a non-oxidative raw material gas via a connection portion of a flange structure;

supplying a non-oxidative gas into the reaction tube through the supply line and the connection portion of the flange structure; and heat-treating the mirror finished silicon wafer in the heat treatment furnace in an atmosphere of a non-oxidative gas, wherein a content of impurities in the non-oxidative gas supplied into the reaction tube is 3 ppm or less.

2. The manufacturing process for a mirror finished silicon wafer according to claim 1, wherein a haze level is 0.1 ppm or less on the whole surface of the mirror finished silicon wafer, and a P-V value is 1.5 rim or less and a Rms value is 0.15 rim or less in each 2 μm×2 μm area thereof.

3. The manufacturing process for a mirror finished silicon wafer according to claim 1, wherein a supply amount of the non-oxidative raw material gas is 15 l/min or more during the heat treatment.

4. The manufacturing process for a mirror finished silicon wafer according to claim 3, wherein a haze level is 0.1 ppm or less on the whole surface of the mirror finished silicon wafer, and a P-V value is 1.5 nm or less and a Rms value is 0.15 nm or less in each 2 μm×2 μm area thereof.

5. The manufacturing process for a mirror finished silicon wafer according to claim 1, wherein the non-oxidative raw material gas is an Ar gas or an Ar gas including a hydrogen gas the content of which is equal to or less than a lower explosion limit.

6. The manufacturing process for a mirror finished silicon wafer according to claim 5, wherein a haze level is 0.1 ppm or less on the whole surface of the mirror finished silicon wafer, and a P-V value is 1.5 nm or less and a Rms value is 0.15 nm or less in each 2 μm×2 μm area thereof.

7. The manufacturing process for a mirror finished silicon wafer according to claim 1, wherein the heat treatment is performed using a horizontal furnace.

8. The manufacturing process for a mirror finished silicon wafer according to claim 7, wherein a haze level is 0.1 ppm or less on the whole surface of the mirror finished silicon wafer, and a P-V value is 1.5 nm or less and a Rms value is 0.15 nm or less in each 2 μm×2 μm area thereof.

9. The manufacturing process for a mirror finished silicon wafer according to claim 1, wherein the heat treatment is performed using a vertical furnace.

10. The manufacturing process for a mirror finished silicon wafer according to claim 9, wherein a haze level is 0.1 ppm or less on the whole surface of the mirror finished silicon wafer, and a P-V value is 1.5 nm or less and a Rms value is 0.15 nm or less in each 2 μm×2 μm area thereof.

11. The manufacturing process for a mirror finished silicon wafer according to claim 1, wherein impurities contained in the non-oxidative gas are impurities originally contained in the non-oxidative raw material gas and/or the outside air intruding into the reaction tube.

12. The manufacturing process for a mirror finished silicon wafer according to claim 11, wherein a haze level is 0.1 ppm or less on the whole surface of the mirror finished silicon wafer, and a P-V value is 1.5 nm or less and a Rms value is 0.15 nm or less in each 2 μm×2 μm area thereof.

13. The manufacturing process for a mirror finished silicon wafer according to claim 11, wherein the non-oxidative raw material gas is an Ar gas or an Ar gas including a hydrogen gas the content of which is equal to or less than a lower explosion limit.

14. The manufacturing process for a mirror finished silicon wafer according to claim 13, wherein a haze level is 0.1 ppm or less on the whole surface of the mirror finished silicon wafer, and a P-V value is 1.5 nm or less and a Rms value is 0.15 nm or less in each 2 μm×2 μm area thereof.

15. A heat treatment furnace for heat-treating a mirror finished silicon wafer in an atmosphere of non-oxidative gas comprising:

a reaction tube of the heat treatment furnace;

a supply line for a non-oxidative raw material gas; and a connection portion of a flange structure connecting the reaction tube and the supply line, wherein the non-oxidative gas is supplied through the supply line and the connection portion of the flange structure, and an intruding amount of the outside air from the connection portion of the flange structure during the heat treatment is 1 ppm or less of a supply amount of the non-oxidative raw material gas.

16. The heat treatment furnace according to claim 15, wherein the non-oxidative raw material gas is an Ar gas or an Ar gas including a hydrogen gas the content of which is equal to or less than a lower explosion limit.

* * * * *